United States Patent [19]

Lowndes et al.

[11] Patent Number: 5,499,599

[45] Date of Patent: Mar. 19, 1996

[54] METHOD FOR CONTINUOUS CONTROL OF COMPOSITION AND DOPING OF PULSED LASER DEPOSITED FILMS BY PRESSURE CONTROL

[75] Inventors: Douglas H. Lowndes; James W. McCamy, both of Knoxville, Tenn.

[73] Assignee: Martin Marietta Energy Systems, Inc., Oak Ridge, Tenn.

[21] Appl. No.: 289,100

[22] Filed: Aug. 11, 1994

Related U.S. Application Data

[63] Continuation of Ser. No. 132,528, Oct. 6, 1983, Pat. No. 5,386,798.

[51] Int. Cl.$^6$ .................................................. H01L 21/20
[52] U.S. Cl. ...................... 117/50; 437/105; 437/126; 204/298.03; 204/192.13
[58] Field of Search .................................. 437/126, 165, 437/133, 105; 117/50; 204/192.13, 298.03

[56] References Cited

U.S. PATENT DOCUMENTS

| | | | |
|---|---|---|---|
| 4,483,725 | 11/1984 | Chang | 204/192 R |
| 5,110,790 | 5/1992 | Feenstra et al. | 505/1 |
| 5,164,040 | 11/1992 | Eres et al. | 156/613 |
| 5,246,885 | 9/1993 | Braren et al. | 437/233 |
| 5,320,865 | 6/1994 | Nakahata et al. | 427/100 |
| 5,324,552 | 6/1994 | Opower et al. | 427/255.1 |
| 5,372,089 | 12/1994 | Yoshida et al. | 117/98 |

FOREIGN PATENT DOCUMENTS

| | | |
|---|---|---|
| 2311398 | 3/1991 | Japan . |
| 2311397 | 3/1991 | Japan . |
| 4219301 | 12/1992 | Japan . |

OTHER PUBLICATIONS

Rimei et al. in Appl. Phys. Lett. 59(18) Oct. 1991, pp. 2266–2268, Preparation of oriented silicon carbide films by laser ablation of ceramic silicon carbide targets.

Balooch et al. in Appl. Phys. Lett. 57(15), Oct. 1990, pp. 1540–1542, Deposition of SiC films by pulsed excimer laser ablation.

Hutchins in IBM TD Bulletin vol. 16(8), Jan. 1974, pp. 2585–2586, Localized semiconductor diffusions utilizing local laser melting in doping atmosphere.

Primary Examiner—R. Bruce Breneman
Assistant Examiner—Ramamohan Rao Paladugu
Attorney, Agent, or Firm—Michael E. McKee; H. W. Adams

[57] ABSTRACT

A method for growing a deposit upon a substrate of semiconductor material involves the utilization of pulsed laser deposition techniques within a low-pressure gas environment. The substrate and a target of a first material are positioned within a deposition chamber and a low-pressure gas atmosphere is developed within the chamber. The substrate is then heated, and the target is irradiated, so that atoms of the target material are ablated from the remainder of the target, while atoms of the gas simultaneously are adsorbed on the substrate/film surface. The ablated atoms build up upon the substrate, together with the adsorbed gas atoms to form the thin-film deposit on the substrate. By controlling the pressure of the gas of the chamber atmosphere, the composition of the formed deposit can be controlled, and films of continuously variable composition or doping can be grown from a single target of fixed composition.

8 Claims, 4 Drawing Sheets

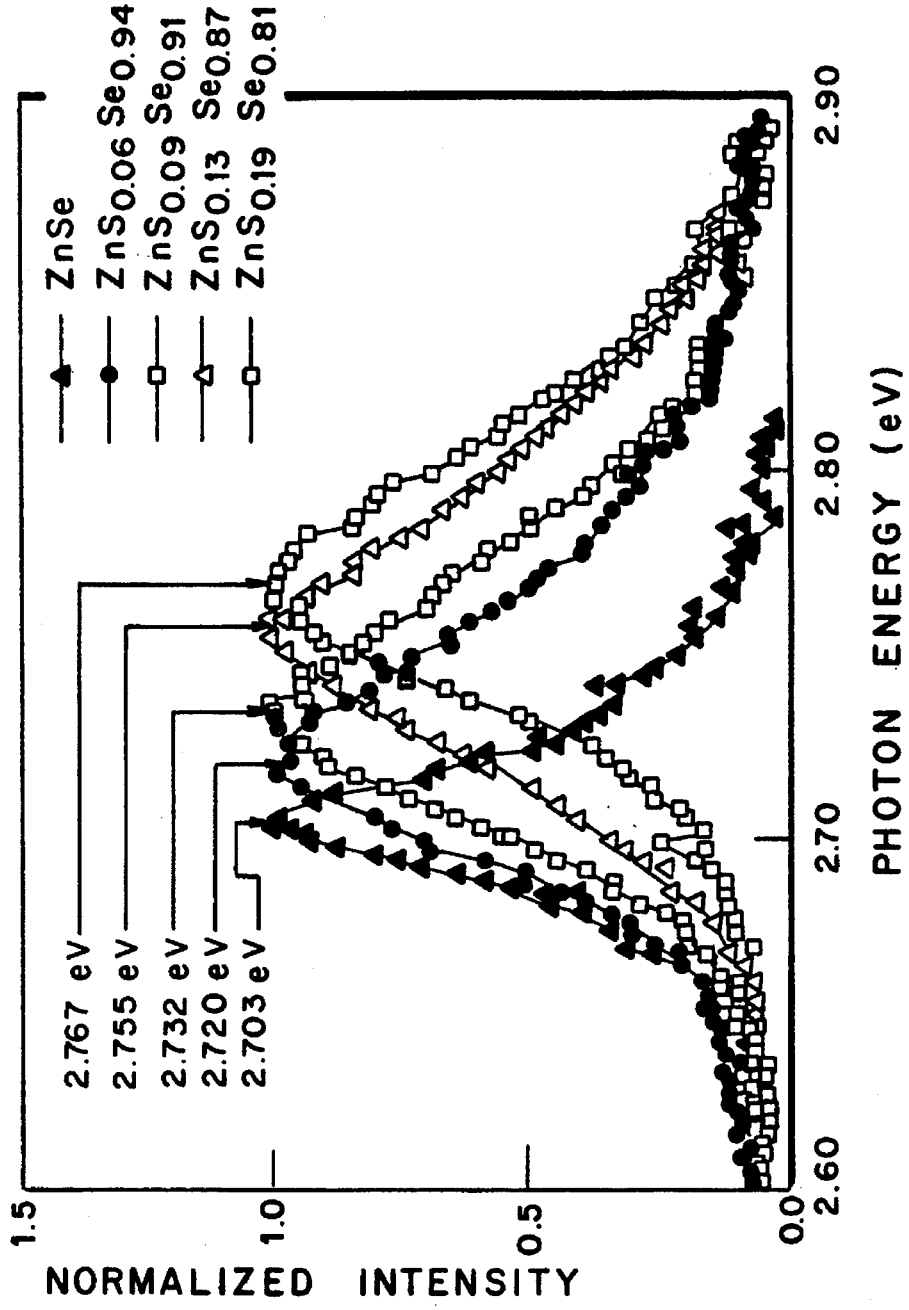

METHOD FOR CONTINUOUS CONTROL OF COMPOSITION AND DOPING OF PULSED LASER DEPOSITED FILMS BY PRESSURE CONTROL

This is a continuation of application Ser. No. 08/32,528, filed Oct. 6, 1983, now U.S. Pat. No. 5,386,798.

BACKGROUND OF THE INVENTION

This invention relates generally to the growth of semiconducting thin-film materials and relates, more particularly, to the deposition of thin film materials upon heated substrates by pulsed laser techniques.

Pulsed laser deposition (PLD) is a film growth method in which a solid (usually polycrystalline) target is irradiated with a pulsed laser beam. During the initial moments of each laser pulse, atoms are desorbed from the target and a laser-generated plasma is formed adjacent to the target surface. During the latter moments of each pulse, the laser heating of the plasma and its interaction with the target result in a thin near-surface layer of the target being decomposed down to the atomic and molecular level and ejected from the target. This process is known as pulsed laser ablation (PLA). Rapid expansion of the heated plasma causes the ablated material to be ejected nearly perpendicular to the target surface in the form of an energetic beam of electrons, ions, atoms and very simple molecules. Film growth occurs when this energetic ablation beam is deposited on a heated substrate located nearby.

Heretofore, two methods have been used to vary the composition of pulsed laser deposition (PLD) films. In a first known method, several targets are used wherein the targets are of different, fixed chemical compositions. However, the use of this first method is limited in that it permits only films of the same fixed compositions to be grown (e.g., $A_{o.9}B_{o.1}$, $A_{0.8}B_{0.2}$, $A_{0.5}$, etc.), rather than a continuous range of compositions (e.g., $A_{1-x}B_x$ wherein "x" is variable).

In the second known method, laser atomic layer epitaxy (laser ALE) is used in which a single unit-cell thickness of a crystalline film is built up atomic layer-by-atomic layer by alternately ablating targets comprised of the pure elements A and B. An arbitrary composition $A_{1-x}B_x$ can be grown in this manner, but it is necessary to repeat the process in a unit cell-by-unit cell construction in order to build up a film of useful thickness. Consequently, the laser ALE process is relatively slow and tedious and is impractical for many applications.

To control the useful electrical properties of semiconductor materials, doping is required during the growth of the materials. Doping is carried out by adding a relatively small and carefully controlled amount of a specific, i.e., predetermined, chemical impurity atom to the semiconductor during growth. In order that the doping operation be successful, the dopant (chemical impurity) atom must substitutionally replace a specific one of the elements in the host semiconductor material. For example, "p-type" electrically conducting ZnSe can be produced by replacing a small number of selenium (Se) atoms by nitrogen (N) impurities, forming $ZnSe_{1-y}N_y$, wherein the nitrogen concentration "y" typically ranges only from 0.000001 to 0.01 ($10^{-2}$). Because of the very small dopant concentration "y", it is extremely difficult to produce laser ablation targets that contain a uniform distribution of exactly the right dopant atom concentration. For the targets to be inexpensive, they must be polycrystalline, but impurity atoms will segregate to the polycrystalline grain boundaries and/or diffuse along them during the heating that typically is required for target fabrication. Furthermore, even if a uniformly doped target could be formed, a new target with different composition would be required in order to change the dopant concentration.

It is an object of the present invention to provide a new and improved method for depositing thin film materials upon heated substrates by pulsed laser techniques.

Another object of the present invention is to provide such a method which circumvents the aforementioned limitation of pulsed laser film growth wherein film composition is limited to that of the ablation target.

Still another object of the present invention is to provide such a method which effects a relatively rapid growth of the film upon the substrate.

Yet another object of the present invention is to provide such a method wherein dopant atoms can be introduced into a semiconductor film with relatively high precision in order to control the film properties.

SUMMARY OF THE INVENTION

This invention resides in a method for growing a deposit upon a substrate while utilizing pulsed laser deposition techniques.

The method includes the steps of positioning a target and a substrate adjacent one another in a low-pressure gas atmosphere and heating the substrate to an elevated temperature so that the gas of the atmosphere may dissociate into atoms or molecules and/or is adsorbed into the heated substrate surface. The target is then irradiated with a pulsed laser beam so that the near-surface of the target is ablated from the remainder of the target and deposited upon the heated substrate, together with the atoms of the dissociated and/or adsorbed gas. By controlling the pressure of the gas of the atmosphere, the composition and/or doping of the film being grown can be controlled continuously, precisely and reproducibly.

BRIEF DESCRIPTION OF THE DRAWINGS

FIG. 3 is a graph setting forth photoluminescence data also relating to the composition of the test samples.

DETAILED DESCRIPTION OF AN ILLUSTRATIVE EMBODIMENT

Figure 1:
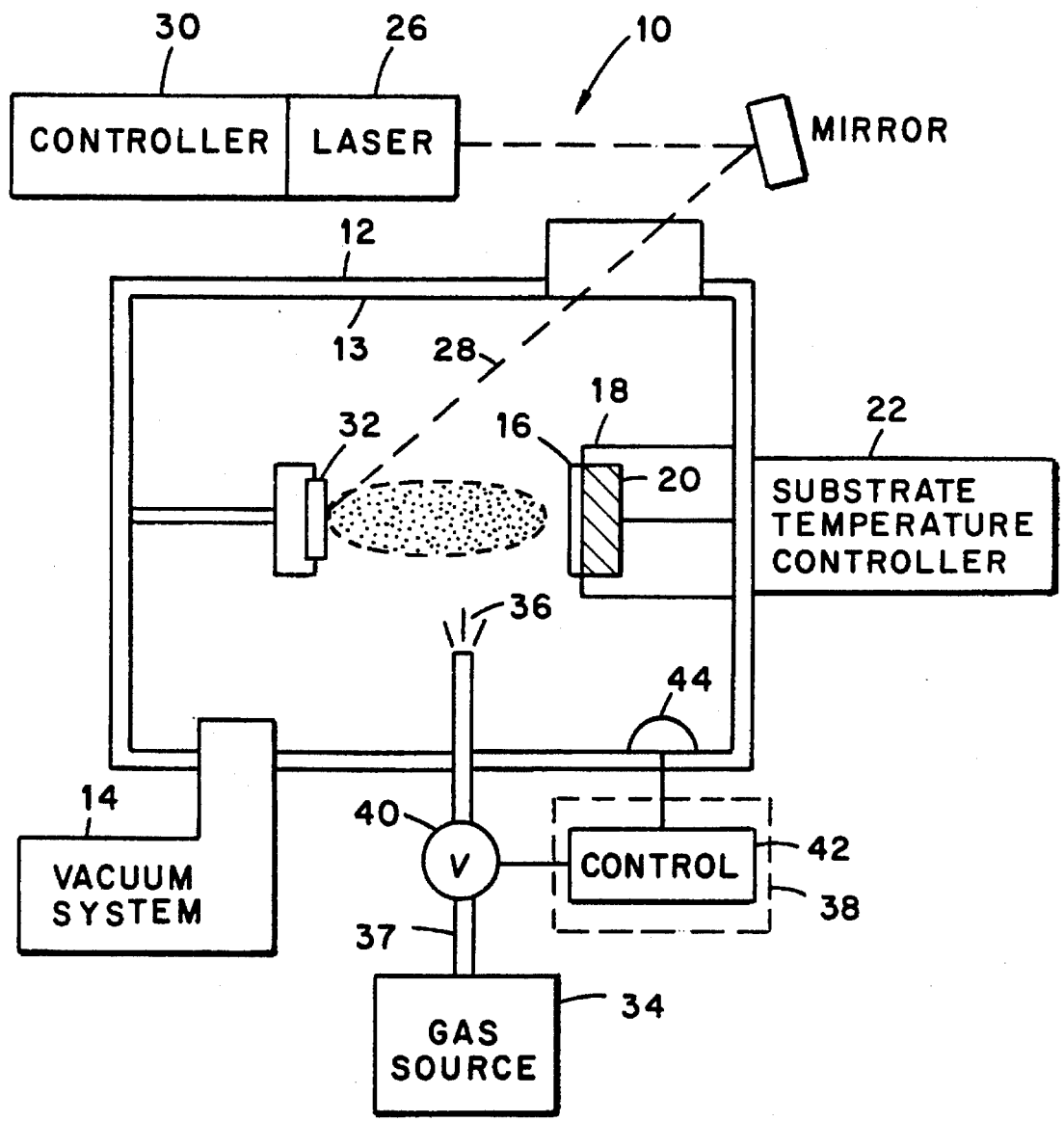
FIG. 1 is a schematic view illustrating the system with which the method of the invention is carried out.

Turning now to the drawings in greater detail, there is illustrated in FIG. 1 a system, generally indicated 10, with which film deposition processes in accordance with the present invention can be performed. The system 10 includes a reaction, or deposition, vessel 12 having an interior chamber 13 within which a film deposit is grown upon a substrate (sample) 16 positioned within the chamber 13. The reaction vessel 12 may be constructed of, for example, stainless steel. The system 10 also includes a vacuum system 14 which is suitably coupled to the vessel 12 in order to lower the internal pressure of the chamber 13 to an ultra-low pressure, e.g., about 10" Torr or less. The substrate 16 is supported within the chamber 13 on a support 18 and in a condition to be heated by a heater 20. During a deposition process, the heater 20, in conjunction with a temperature controller 22, maintains the temperature of the substrate 16 at a preselected, elevated level.

The method of the invention employs pulsed laser deposition (PLD) techniques in the formation of a deposit upon the substrate 16. To this end, the system 10 includes a laser 26 arranged adjacent the reactor vessel 12 and an accompanying laser control system 30 to generate a pulsed laser beam 28. A target 32 is suitably supported within the chamber 13 for receiving the pulsed beam 28 of the laser 26. During the growth of a deposit upon the substrate 16, atoms are ablated from the target 32 and deposited upon the surface of the substrate 16. Accordingly, the material comprising the target 32 is preselected to include some of the atoms desired to be used in the thin film deposited upon the substrate 16.

In the interests of the present invention, the terms "atom" and "atomic" are used to designate the lowest level to which the structure of the target 32 is decomposed by the laser beam 28. Similarly, the term "atomic level" is intended to encompass alternative states of small numbers of atoms bound together, such as at the "molecular level".

The growth of a deposit upon a substrate 16 with the system 10 is conducted in a relatively low-pressure gas atmosphere. In this connection, the system 10 includes a source 34 of gas 36 and a conduit 37 for delivering the gas 36 (under a low pressure) to the interior of the chamber 13. A pressure control system 38 including a valve 40 and a valve controller 42 are associated with the conduit 37 for regulating the flow of gas 36 into the chamber 13. The pressure control system 38 also includes a feedback loop including a pressure sensor 44 appropriately connected to the valve controller 42 for monitoring the absolute internal pressure (relative to a vacuum) of the interior of the chamber 13.

The substrate 16 is heated to an elevated temperature (normally between about 250° C. and 450° C.) so that a film with desired properties can be grown. Substrate heating also may assist the gas of the vessel atmosphere to be dissociated to its atomic or molecular level (depending upon the species of gas), and in any case, the gas will be adsorbed on the substrate 16. Thus, the gas is preselected for its inclusion of atoms desired to be used in modifying and controlling the composition of the thin-film deposit upon the substrate 16. Accordingly, the composition and partial vapor pressure of the gas 36, as well as that of the target 32, is determined by the desired composition of the deposit to be grown upon the substrate 16.

To prepare the system 10 for the formation of the deposit upon the substrate 16, the substrate 16 and the target 32, of a first material, are positioned within the chamber 13 of the vessel 12, and the vacuum system 14 is actuated to evacuate the chamber 13 to a low pressure, e.g. $10^{-6}$ Torr or less. An amount of gas 36 is slowly admitted into the chamber 12 through the conduit 37 while the control system 38 monitors the internal pressure of the chamber 13. Upon reaching the desired internal pressure of the chamber 13, the valve 40 is partially closed by the controller 42. During the growth operation which follows, the control system 38 continues to monitor the internal pressure of the chamber 13 and controls the flow of gas 36 through the conduit 37 for maintaining or altering, as desired, the internal pressure of the chamber 13.

The substrate 16 is heated, and the laser 26 is actuated to ablate atoms from the near-surface of the target 32. The ablated atoms from the target 32 and those of the adsorbed gas are incorporated together in the thin film growth upon the substrate 16, to thereby effect the desired compositional control of film growth.

By controlling the pressure of the gas 36 within the chamber 13, the composition of the deposit grown upon the substrate 16 can be accurately and continually controlled. Furthermore, by altering the gas pressure during the film growth process, the composition of adjacent layers of the film being formed are altered accordingly. Still further, rather than utilizing a pure gas as the gas 36, a gas containing dopant atoms can be introduced in the chamber 13 (at a controlled pressure) to grow a film with dopant atoms dispersed through the film. In this latter case, the dopant atoms would be incorporated at substantially uniform locations throughout the film.

EXPERIMENTAL RESULTS: Variation of Composition

Experiments to demonstrate the method of the invention were carried out using a pulsed KrF (248 nm wavelength) excimer laser to irradiate a ZnSe target in a low-pressure $H_2S$ gas atmosphere. Crystalline films of $ZnSe_{1-x}S$, (wherein "x" is variable) were grown on (001)-oriented single crystal GaAs (and other) substrates. ZnSe and ZnS are wide bandgap II-VI semiconductor materials having energy bandgaps of 2.7 eV and 3.7 eV, respectively, and lattice constants of 5.668 Å and 5.409 Å, respectively. By forming intermediate compositions, $ZnSe_{1-x}S_x$, the energy bandgap and lattice constant can be continuously varied between these end-point values.

X-ray diffraction and photoluminescence measurements were conducted on resultant film samples to demonstrate that the lattice constant and energy bandgap can be continuously varied by the invention process, and that films with compositions intermediate, or between, pure ZnSe and ZnS were grown on the resultant samples.

Data is presented here from PLD experiments in which a ZnSe target was ablated into a low-pressure $H_2S$ gas atmosphere. The hydrogen in the $H_2S$ molecule is volatile and, during film growth, is carried off in the gas phase (probably as $H_2$), so that only sulphur is incorporated in the resulting $ZnSe_{1-x}S_x$ film, with the sulphur concentration "x" determined by the $H_2S$ partial pressure. A pure ZnSe buffer layer was grown first on the (001) GaAs substrate, and then the $ZnSe_{1-x}S_x$ alloy films were grown on top of the ZnSe buffer layer. The following Table I lists the film samples which were grown by the experiments in this series.

TABLE I

| Sample No. | x % | Pressure [$H_2S$] (mtorr) | Buffer thickness (nm) | Alloy thickness (nm) |
|---|---|---|---|---|
| 1 | 0 | 0 | 230 | None |
| 2 | 6 | 7.5 | 20 | 990 |
| 3 | 9 | 11 | 300 | 300 |
| 4 | 13 | 22 | 300 | 300 |
| 5 | 18 | 44 | 250 | 250 |

X-ray lattice constants were measured for all five of the $ZnSe_{1-x}S_x$ alloy films, and the alloy composition "x" was inferred directly from the lattice constant, assuming Vegard's Law. There is shown in the graph of FIG. 2 the variation of film composition with $H_2S$ partial pressure.

Figure 2:
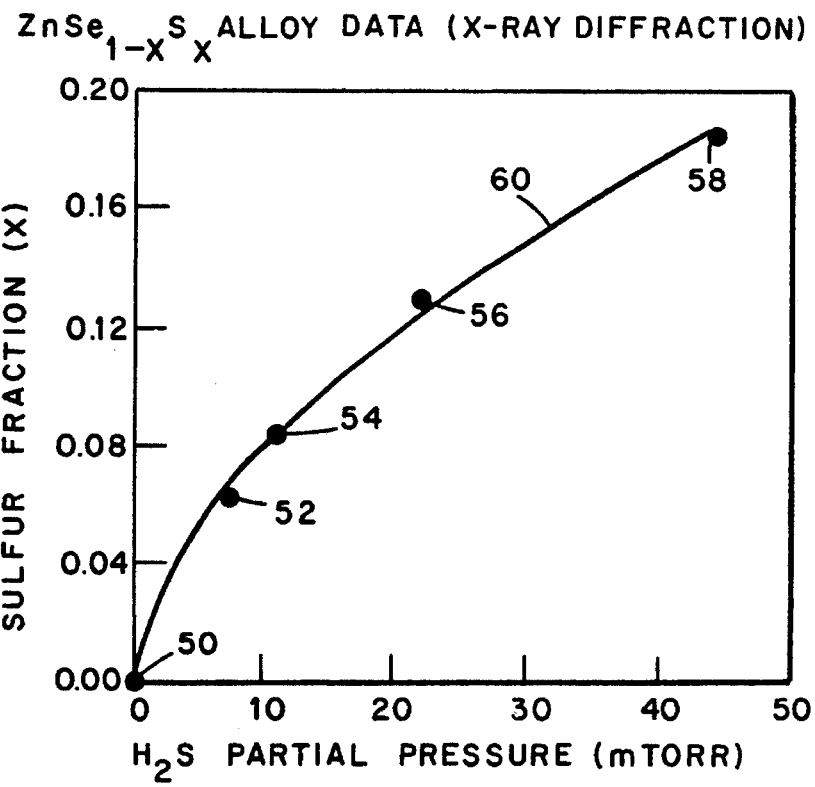
FIG. 2 is a graph containing data relating to the composition of test samples.

Using the "x" and pressure values in Table I as the ordinate and abscissa, respectively, of data points, these points are plotted on the FIG. 2 graph and identified 50, 52, 54, 56 and 58 thereon. The solid curve, indicated 60, is a fit to the data points and shows that the sulphur content of the film scales with the square root of the $H_2S$ partial pressure.

Room temperature photoluminescence measurements were also conducted on each sample to independently measure the energy bandgap $E_g$ of its alloy film. The energy of the photoluminescence peak is very nearly the $E_g$ value, and FIG. 3 clearly shows the systematic shift in the photoluminescence peak position (and $E_g$) with increasing sulphur content.

Figure 4:
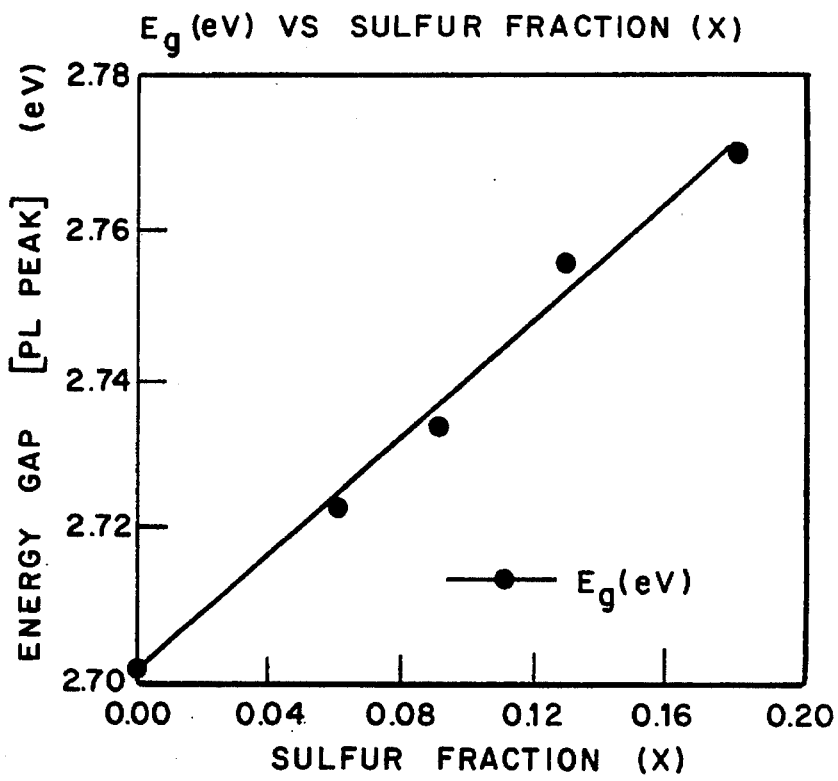
FIG. 4 is a graph on which X-ray and photoluminescence data is plotted.

In FIG. 4, the independently-determined (x-ray and photoluminescence) values of "x" and $E_g$ are plotted against each other, and the results display a smooth, systematic variation that is linear within the limits of experimental accuracy, thereby demonstrating the mutual consistency of the x-ray and photoluminescence measurements and the ability to continuously control film composition via the partial pressure of the gas molecules.

Having established the ability to sensitively control alloy film composition, we have used this method to fabricate unique epitaxial multilayered semiconductor-superlattice structures based on $ZnSe_{1-x}S_x$. These are structures with a continuous crystalline structure but with a periodic alternation in the composition of successive layers. The thickness of each layer was controlled by the number of laser shots, while the composition "x" was determined by the ambient $H_2S$ gas pressure. By varying the gas pressure between two limiting values, and maintaining each pressure for a fixed number of laser shots, structures with highly reproducible layer thickness and composition were fabricated.

Alternatively, it was-found that by gradually increasing the gas pressure during film growth, a crystalline film could be grown with continuously changing composition along the growth direction. By combining these two recipes, i.e., the maintenance of a pressure for a fixed number of laser shots and the continuous altering of gas pressure during film growth, it was found that a graded transition from one end-point composition to another end-point composition could be made with a simultaneous compositional modulation superimposed. These are unique capabilities that cannot be achieved by conventional growth methods.

Figure 5:
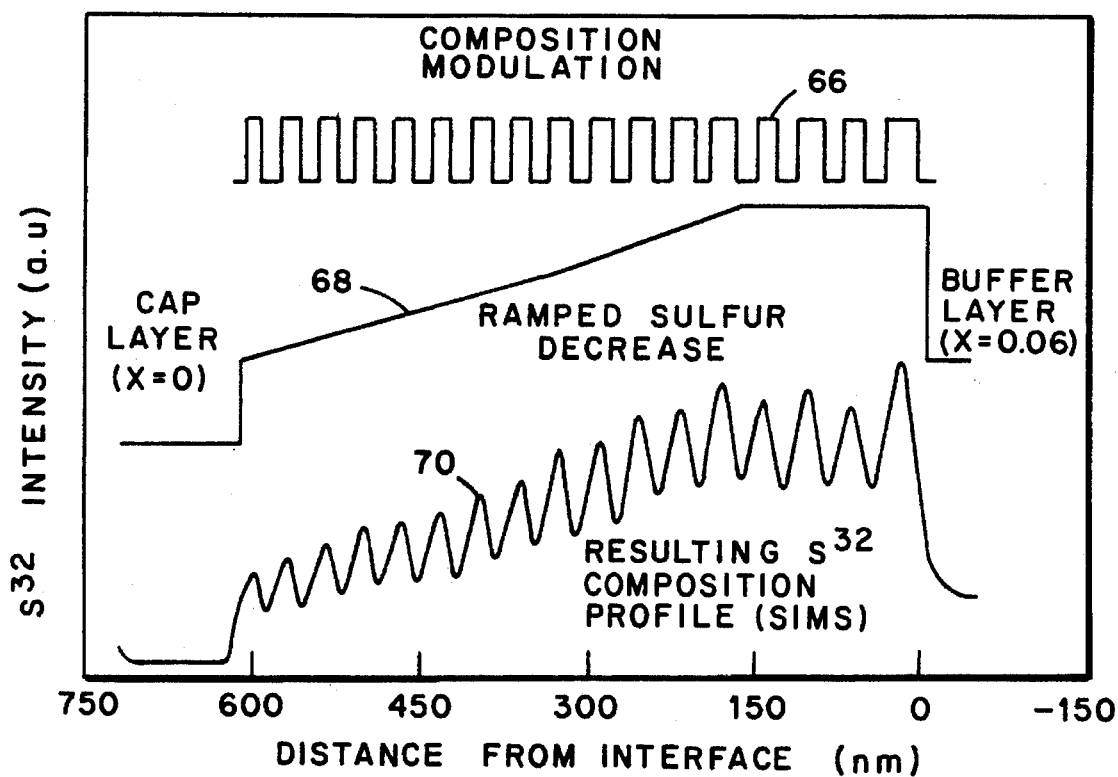
FIG. 5 is a plot of sulphur composition versus depth data obtained with test samples.

There is shown in FIG. 5 the sulphur composition profile of a $ZnSe_{1-x}S_x$ multilayered structure that was fabricated so as to simultaneously incorporate both continuously graded and abrupt, i.e., periodic, compositional changes. The top two curves, indicated 66 and 68 in FIG. 5, show separately the idealized graded and modulated profiles. The lower curve, indicated 70 in FIG. 5, shows the resulting experimental sulphur profile, as determined by secondary ion mass spectroscopy (SIMS). First, a $ZnSe_{1-x}S_x$ buffer layer with x=6% (shown for distance <0 in FIG. 5) was grown on the (001) GaAs substrate (using the $H_2S$ pressure to produce the x=0.06 composition), in order to match the lattice constant with GaAs and reduce strain in the resulting crystalline structure. The average sulphur content then was increased to 18% and held constant from 0 nm to 165 nm (measured from the end of the buffer layer), but with a±3% compositional modulation also superimposed. The sulphur content next was gradually ramped down from 18% (at 165 nm) to 6% (at 600 nm), again with a simultaneous compositional modulation by±3%. Finally, a pure ZnSe capping layer was grown. The periodically modulated part of this structure consisted of 16.5 modulation periods of 36 nm each. This procedure resulted in a continuous crystalline structure composed of distinct layers (including the buffer and cap layers). Moreover, the depth resolution of the resulting profile (determined by SIMS) is on the order of 5–10 nm. Thus, the compositional modulation that was actually achieved is more abrupt than is shown in the lower curve, indicated 70, in FIG. 5.

EXPERIMENTAL RESULTS: DOPED FILMS

Experiments were also carried out in accordance with the method of the invention to demonstrate doping of ZnS with Cl atoms (to produce n-type ZnS, if Cl is incorporated only on the S site) in a constant ambient gas pressure of 2 mTorr. The Cl content of the ambient gas was varied by combining two gas streams, one stream of which contained 3.5% HCl in 96.5% He and the other stream of which contained pure He. Thus, by controlling the relative flow rates of the two streams, the HCl partial pressure could be varied from zero to 0.07 mTorr. ZnS films were grown at T=300° C. on (001) GaAs substrates in the presence of the dopent gas.

Figure 6:
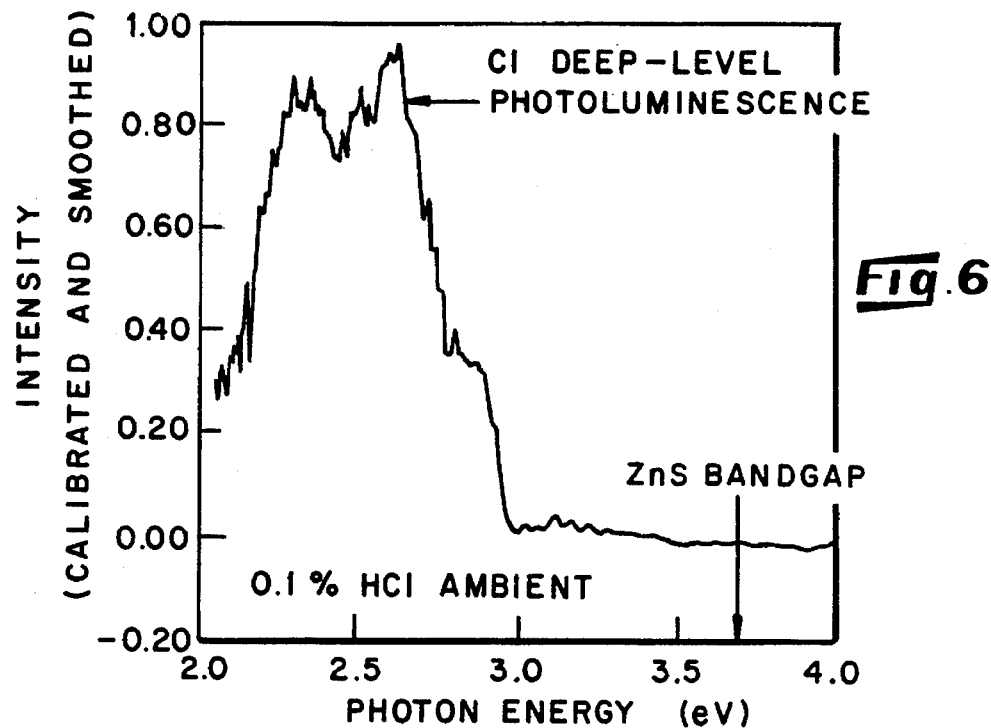
FIG. 6 is a graph of the photoluminescence spectrum from chlorine atoms incorporated in a test sample.

There is shown in FIG. 6 the room temperature photoluminescence spectrum of a ZnS:Cl film grown in a 0.1% (~2μTorr) HCl ambient. The broad emission feature between 2 and 3 eV is due to transitions through mid-bandgap electron energy levels at the Cl sites, thus demonstrating that Cl was incorporated in the ZnS structure. Increasing the HCl partial pressure by a factor of ten produced an increase in the photoluminescence intensity and some broadening of the most prominent peaks. Thus, these experiments demonstrate that ZnS films can be doped with Cl and that the dopant-atom concentration can be controlled via the ambient gas pressure.

It follows that a method has been described for continuously controlling the composition of PLD films, as well as the doping of semiconductor films with continuously variable dopant concentration, by carrying out PLD in a low-pressure ambient gas atmosphere. By selecting the gas appropriately and controlling the pressure thereof, atoms produced by dissociation and/or adsorption of the gas molecules can be incorporated in the growing film, thereby altering its chemical composition. The low and variable density of a gas, compared with a solid, renders possible very sensitive compositional control.

It will be understood that numerous modifications and substitutions can be had to the aforedescribed embodiments without departing from the spirit of the invention. Accordingly, the aforedescribed embodiments are intended for the purpose of illustration and not as a limitation.

We claim:

1. A method for growing a thin-film compound semiconductor deposit upon a substrate including the steps of:

positioning a target and a substrate in a low-pressure gas atmosphere;

heating the substrate to an elevated temperature so that a film can be grown and the gas of the atmosphere may dissociate to an atomic or smaller molecular level;

irradiating the target with a laser so that the near-surface of the target is ablated from the remainder of the target and deposited upon the heated substrate, together with the atoms of the gas, in a thin-film deposit; and continuously controlling the accumulation of atoms of the gas upon the substrate during the laser irradiating step to thereby control the concentration of gas atoms within the thin-film deposit being built upon the substrate by controlling the pressure of the gas of the atmosphere throughout the laser irradiating step so that an adjustment in the pressure of the gas of the atmosphere effects a corresponding adjustment in the accumulation of the atoms of the gas upon the substrate.

2. The method as defined in claim 1 wherein the step of controlling includes a step of maintaining the pressure of the gas at a constant level throughout the laser irradiating step.

3. The method as defined in claim 1 wherein the step of controlling includes a step of varying the gas pressure between two pressure levels during the laser irradiating step.

4. The method as defined in claim 1 wherein the gas of the atmosphere includes dopant atoms so that the deposit of target and gas atoms upon the substrate includes at least some of the dopant atoms.

5. A method for growing a thin-film compound semiconductor deposit upon a substrate wherein the deposit desired to be grown includes atoms of a first material and atoms of a second material, the method comprising the steps of:

positioning a substrate and a target of a first material into a deposition chamber;

producing within the deposition chamber a low vacuum and then introducing into the deposition chamber a gas including the second material so that the chamber contains a low pressure atmosphere of the gas;

heating the substrate so that a film with the desired properties can be grown and the gas of the atmosphere may dissociate to an atomic or molecular level;

irradiating the target with a laser so that atoms of the first material are ablated from the remainder of the target and deposited upon the heated substrate together with the atoms of the gas in a thin-film deposit; and continuously controlling the accumulation of atoms of the gas upon the substrate throughout the laser irradiating step to thereby control the concentration of gas atoms within the thin-film deposit being built upon the substrate by controlling the pressure of the gas of the atmosphere throughout the laser irradiating step so that an adjustment in the pressure of the gas of the atmosphere effects a corresponding adjustment in the accumulation of the atoms of the gas upon the substrate.

6. The method as defined in claim 5 wherein the step of controlling includes a step of maintaining the pressure of the gas at a constant level throughout the laser irradiating step so that adjacent layers of the deposit include substantially the same composition.

7. The method as defined in claim 5 wherein the step of controlling includes a step of varying the gas pressure between two pressure levels during the laser irradiating step so that adjacent layers of the deposit are of different composition.

8. The method as defined in claim 5 wherein the gas of the atmosphere includes dopant atoms so that the deposit of target and gas atoms upon the substrate includes at least some of the dopant atoms.

* * * * *